United States Patent [19]
Nyseth

[11] Patent Number: 5,816,410
[45] Date of Patent: Oct. 6, 1998

[54] WAFER CUSHIONS FOR WAFER SHIPPER

[75] Inventor: David L. Nyseth, Plymouth, Minn.

[73] Assignee: Fluoroware, Inc., Chaska, Minn.

[21] Appl. No.: 647,684

[22] Filed: May 24, 1996

Related U.S. Application Data

[63] Continuation-in-part of Ser. No. 471,641, Jun. 6, 1995, Pat. No. 5,586,658, and a continuation-in-part of Ser. No. 276,091, Jul. 15, 1994, Pat. No. 5,575,394.

[51] Int. Cl.⁶ .................................................. B65D 85/30
[52] U.S. Cl. ........................................ 206/711; 206/587
[58] Field of Search .................................. 206/710, 711, 206/712, 445, 586, 587, 591, 816; 211/40, 41; 118/500

[56] References Cited

U.S. PATENT DOCUMENTS

| | | |
|---|---|---|
| D. 260,237 | 8/1981 | Fuzere . |
| 4,043,451 | 8/1977 | Johnson .................................. 206/711 |
| 4,235,338 | 11/1980 | Dugan et al. . |
| 4,248,346 | 2/1981 | Johnson . |
| 4,555,024 | 11/1985 | Voss et al. . |
| 4,557,382 | 12/1985 | Johnson . |
| 4,574,950 | 3/1986 | Koe et al. . |
| 4,593,819 | 6/1986 | Will . |
| 4,687,097 | 8/1987 | Mortensen . |
| 4,718,549 | 1/1988 | Rissotti et al. . |
| 4,721,207 | 1/1988 | Kikuchi . |
| 4,747,488 | 5/1988 | Kikuchi . |
| 4,773,537 | 9/1988 | Kikuchi . |
| 4,779,732 | 10/1988 | Boehm et al. . |
| 4,793,488 | 12/1988 | Mortensen . |
| 4,817,799 | 4/1989 | Gregerson et al. . |
| 4,966,284 | 10/1990 | Gregerson et al. . |
| 5,046,615 | 9/1991 | Nentl et al. . |
| 5,228,568 | 7/1993 | Ogino et al. . |
| 5,253,755 | 10/1993 | Maenke .................................. 206/711 X |
| 5,255,797 | 10/1993 | Kos . |
| 5,269,430 | 12/1993 | Schlaupitz et al. . |
| 5,273,159 | 12/1993 | Gregerson ................................ 206/711 |
| 5,586,658 | 12/1996 | Nyseth .................................... 206/711 |

*Primary Examiner*—Jacob K. Ackun
*Attorney, Agent, or Firm*—Palmatier, Sjoquist, Helget & Voigt, P.A.

[57] ABSTRACT

The present invention is a shipping container for safely storing articles such as semiconductor wafers. The shipping container has two sidewalls sealingly connected to two end walls to form a generally rectangular interior wafer confinement area. A top cover and a bottom cover are removably attached to the container to protect the wafers during shipping and storage and provide access to the wafers for processing. The wafers are securely held in place in the carrier by a cushioning means to prevent damage to the wafers. Furthermore, the wafers are locked into place to prevent contamination by the wafers generating particles in the wafer confinement area by rubbing against the carrier. The cushioning means for accommodating the flexing of the cover supports and suspends wafers in the wafer confinement area. The cushioning means extends from the top cover and has a plurality of wafer engaging edges. Each edge is formed in a convex arcuate shape with respect to a centerline of the carrier. The arcuate shape may be formed by an initial arcuate shape in the cover of the shipping device or an arcuate shaped fin extending from the cover of the shipping device. The cushioning means has a configuration to compress when engaged by the wafer to secure the wafer while spacing it from the top cover. The cushioning means may have a continuous wafer engaging edge along the length of the fin or it may be separated into wafer engaging tabs or fingers, each tab or finger individually engaging a wafer. The bottom cover may also have a cushioning means engaging and spacing the wafers from the bottom cover. The structure of the cushioning means on the bottom cover is designed to bend outwardly to lock the wafers from rotating in the shipping device.

37 Claims, 9 Drawing Sheets

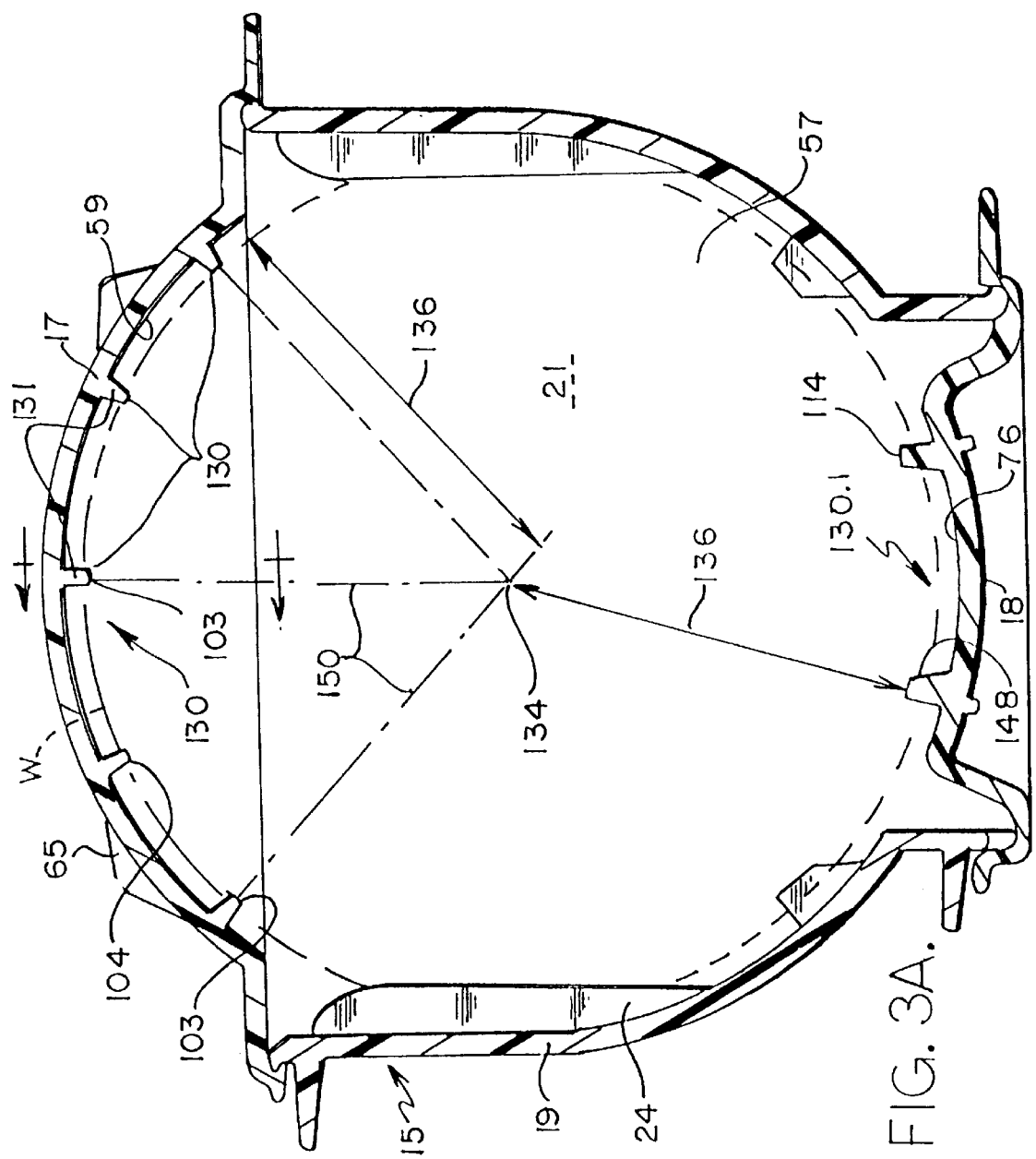

WAFER CUSHIONS FOR WAFER SHIPPER

This application is a continuation-in-part of the application for patent on Wafer Cushions for Wafer Shippers, Ser. No. 08/471,641 filed Jun. 6, 1995 now U.S. Pat. No. 5,586,658 and is also a continuation-in-part of the application for patent on WAFER SHIPPER AND PACKAGE, Ser. No. 08/276,096, filed Jul. 15, 1994 now U.S. Pat. No. 5,575,394.

BACKGROUND OF THE INVENTION

This invention relates to containers and packages for shipping semiconductor wafers and similar objects.

Semiconductor wafers are subjected to numerous steps in their processing. The wafers are subjected to various process steps in various machines and at various locations. The wafers must be transported from place to place and stored over a period of time in order to accommodate the necessary processing. A number of types of transport and shipping devices have been previously known for handling, storing and shipping wafers.

A principal component of the shipping devices is a means for cushioning the wafer to protect against physical damage from shock, vibration, abrasion, and the like. Such shipping containers and cushioning means have been previously known as disclosed in U.S. Pat. Nos. 4,043,451; 4,171,740; 4,248,346; 4,555,024; 4,574,950; 4,557,382; 4,718,549; 4,773,488; 4,817,779; 4,966,284; 5,046,617; 5,253,755; 5,255,797 and 5,273,159. These shipping and transport devices utilize various means on the covers for engaging and cushioning to protect the wafers from physical damage, however, such containers do not provide for accommodation of the inherent flexing of the shipping device covers due to the presence of the wafers.

A desirable feature of shipping and transport devices is to have a top cover that provides a hermetic or near hermetic seal to prevent entry of contaminants.

The use of more flexible plastics for covers, such as polypropylene and Hytrel®, provide for better sealing but the greater flexing of the top cover creates an uneven and inconsistent engagement of the individual wafers. This is because the top covers will bow, that is, the center of the top cover flexes outwardly more than near the edges.

Attempts to deal with the problem of the flexing of the covers have been by way of trying to prevent the bowing of the top cover by adding exterior ribs, changing the top cover structure or using more rigid materials.

SUMMARY OF THE INVENTION

The present invention is a shipping container for safely storing articles such as semiconductor wafers. The shipping container has two sidewalls sealingly connected to two end walls to form a generally rectangular interior wafer confinement area. A top cover and a bottom cover are removably attached to the container to protect the wafers during shipping and storage and provide access to the wafers for processing. The wafers are securely held in place in the carrier by a cushioning means for accommodating flexing of the covers to prevent damage to the wafers. Furthermore, the wafers are locked into place to prevent contamination by the wafers generating particles in the wafer confinement area by rubbing against the carrier. The cushioning means for accommodating the flexing of the cover utilizes the flexing of the cover to support and suspend the wafers in the wafer confinement area. The cushioning means comprises structure in the top cover and a plurality of wafer engagement portions extending inwardly into the container. The wafer engagement portions each have edge portions which are aligned in a convex arcuate shape with respect to a centerline of the carrier. The arcuate shape may also be formed by an initial arcuate shape in the cover of the shipping device or an arcuate shaped fin extending from the cover of the shipping device. The cushioning means has a configuration to compress when engaged by the wafer to secure the wafer while spacing it from the top cover. The cushioning means may have a continuous wafer engaging edge along the length of the fin or it may be separated into wafer engaging tabs or fingers, each tab or finger individually engaging a wafer. The bottom cover may also have a cushioning means engaging and spacing the wafers from the bottom cover. The structure of the cushioning means on the bottom cover is designed to bend outwardly to lock the wafers from rotating in the shipping device.

An object of the present invention is to provide a shipping container with a near hermetic seal on the top cover and having a cushioning means for accommodating flexing of the covers and which utilizes the flexibility of the covers of the shipping container for safely storing and shipping semiconductor wafers to minimize the likelihood of wafer damage or contamination.

A feature of the present invention is a wafer carrier comprising a container with side and end walls, a removable top cover defining a top wall and a removable bottom cover defining a bottom wall. Wafer separating ribs are positioned on the side walls for holding the wafers in a spaced relation to each other.

Another feature of the present invention is a cushioning means on the top cover. The cushioning means comprising a plurality of fins disposed longitudinally along the top cover and extending radially into the wafer confinement area.

Another feature of the present invention is each fin may have a continuous wafer engaging edge along the length of the fin.

Another feature of the present invention is that each fin may be a row comprising a plurality of separately extending cushioning tabs having a slot between each pair of adjoining tabs forming a discontinuous wafer engaging edge having a substantially convex arcuate shape with respect to the centerline of the carrier. Each cushioning tab having a wafer engaging edge.

Another feature of the present invention is a structure in each fin on the top cover designed to resiliently indent along a radius of the wafer at the wafer engagement portion.

Another feature of the present invention is a second cushioning means on the bottom cover having a wafer engaging edge. The cushioning means on the bottom cover supporting the wafers and spacing the wafers from the bottom cover while accommodating flexing of the bottom cover due to the weight of the wafers.

Another feature of the present invention is the cushioning means in the top or bottom cover may have a structure, such as a fin or row of engaging members, which is designed to be more compressible at either end of the container and less compressible in the middle portion of the container to accommodate and utilize the flexing of the cover of the shipping device.

Another feature of the present invention is the positioning of the fins on the top cover to maximize the cushioning effect on the wafers. A top fin may be located along the center of the top cover.

Another feature of the present invention is the fin may be formed integral with the cover to minimize manufacturing costs.

Another feature of the present invention is the slot between tabs allows each tab to flex individually when engaging a wafer and prevent the flexing of one tab from effecting the alignment or engagement of other tabs with their respective wafers.

Another feature of the present invention is each fin may have the form of a bead extending longitudinally on the inside of the cover.

Another feature of the present invention is that the edge of the fin or engagement portions may take the form of a point, a bead or a flat surface.

Another feature of the present invention is the wafer engaging edge is spaced from the center line of the carrier by a radial distance. The radial distance progressively increasing from the middle portion of the fin to the portions of the fin adjacent to the end walls.

Another feature of the present invention is the cushioning means on the bottom cover may have the form of a pair of fins running longitudinally along the bottom cover. A structure of each fin on the bottom cover designed to resiliently bend to lock the wafer in place restraining rotation of the wafer.

Another feature of the present invention is the wafer engaging edge on the cushioning means on the bottom cover having an arcuate convex shape toward the centerline of the carrier.

BRIEF DESCRIPTION OF THE DRAWINGS

FIG. 3A is a sectional view through the shipping container taken on a broken line as indicated at 3—3 of FIG. 1 particularly indicating the radial alignment of the fins in the top cover.

FIG. 6A is an enlarged detail section view taken at approximately 6—6 of FIG. 5 illustrating a bead configuration of the fin.

FIG. 6B is an enlarged detail section view taken at approximately 6—6 of FIG. 5 illustrating a knife-shaped wafer engaging edge.

FIG. 6C is an enlarged detail section view taken at approximately 6—6 of FIG. 5 illustrating a flat wafer engaging edge.

FIG. 6D is an enlarged detail section view taken at approximately 6—6 of FIG. 5 illustrating a rounded wafer engaging edge.

DETAILED DESCRIPTION OF THE PREFERRED EMBODIMENTS

Figure 1:
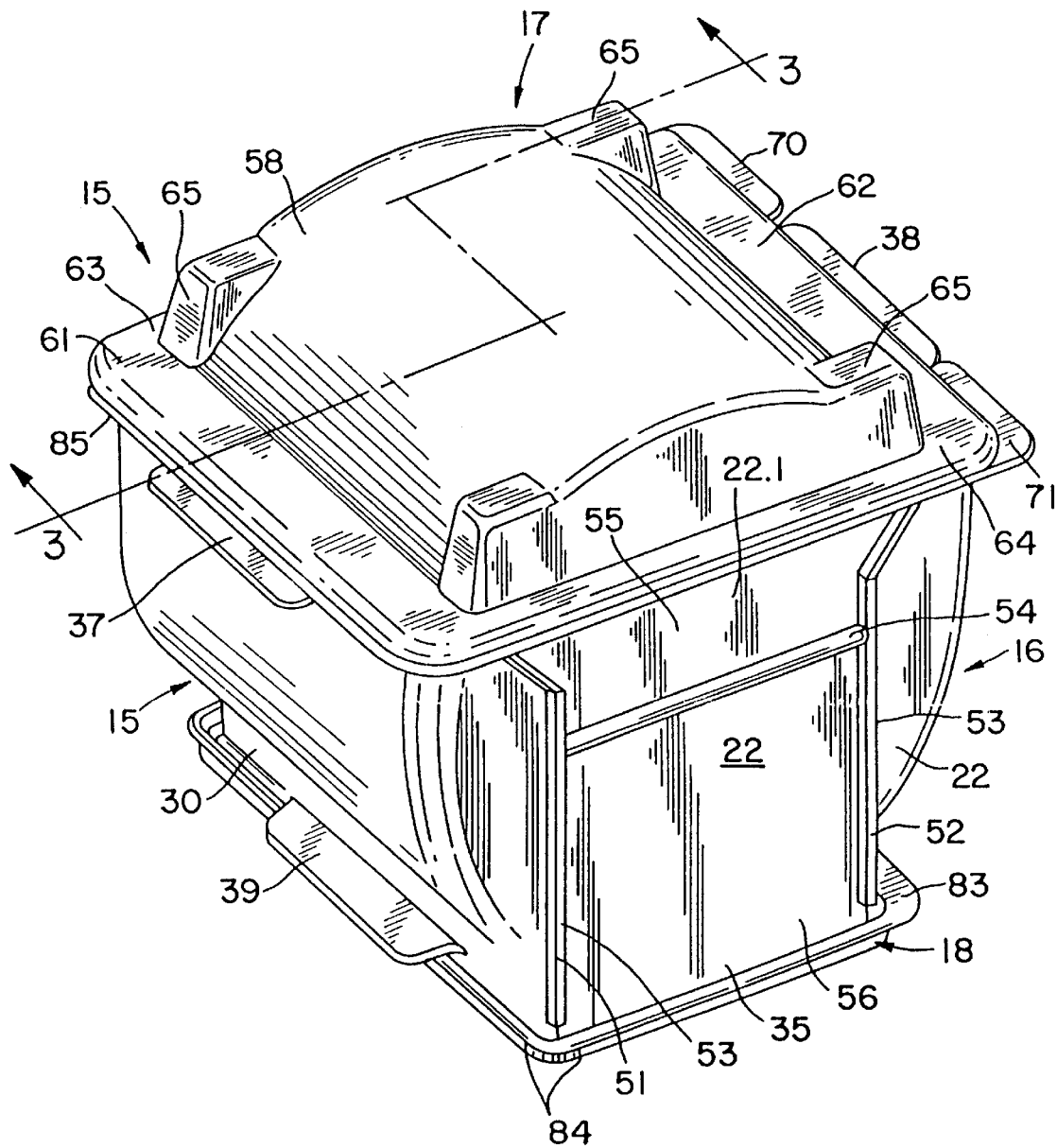
FIG. 1 is a perspective view of a plastic shipping container.
Figure 2:
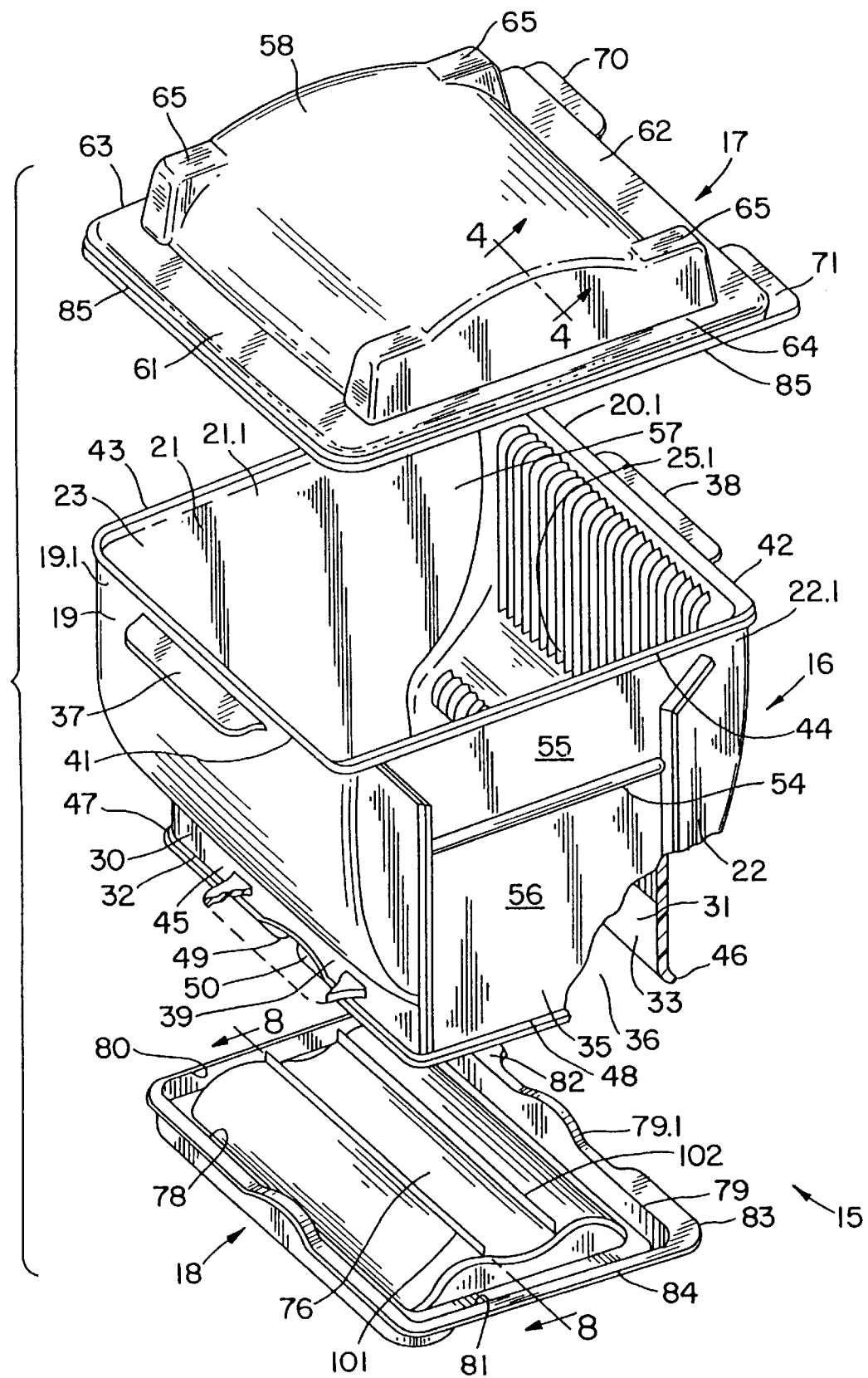
FIG. 2 is a perspective view of the shipping container in exploded condition to show the three principal parts.

Referring to FIGS. 1 and 2, the shipping container is indicated in general by numeral 15 and comprises a wafer carrier 16, a top cover 17 and a bottom cover 18.

The wafer carrier 16 is preferably molded of a substantially rigid and transparent plastic material, such as polycarbonate, although the wafer carrier might be molded of other comparable or equivalent plastics. The top cover 17 and bottom cover 18 are both molded of a substantially stiff but resiliently and flexibly yieldable plastic material, such as a thermoplastic elastomer known by its trademark Hytrel®, a registered trademark of DuPont. The bottom cover 18 forms a bottom wall of container 15. The Hytrel thermoplastic elastomer, in all of its grades, are block copolymers, consisting of a hard (crystalline) segment of polybutelyne terephthalate and a soft (amorphous) segment based on long-chain polyether glycols. The particular material used in the top and bottom covers 17 and 18 has a hardness, durometer D in the range of 45 to 55 to 63, and the material is elastic and has a sticky tack at the surface, providing for maximum grip and minimum creep of material and a high abrasion resistance. In addition, the stiff but resiliently yieldable material in the top and bottom covers resists deterioration from many industrial chemicals, oils and solvents.

The wafer carrier 16 comprises four encompassing walls specifically identified as sidewalls 19 and 20 and end walls 21 and 22. The sidewalls 19 and 20 and end walls 21 and 22 are molded integrally of each other so that the plastic wafer carrier 15 is in one piece. The upper edge portions 19.1, 20.1, 21.1 and 22.1 of the sidewalls and end walls are in substantially linear relation to each other with respect to each other, lying in a plane and defining the top opening 23 of the carrier facilitating loading the wafers W into the wafer carrier and unloading the wafers from the wafer carrier 15. The wafers W may be of the type used in semiconductor manufacturing or magnetic memory storage systems such as disk platters.

Figure 3:
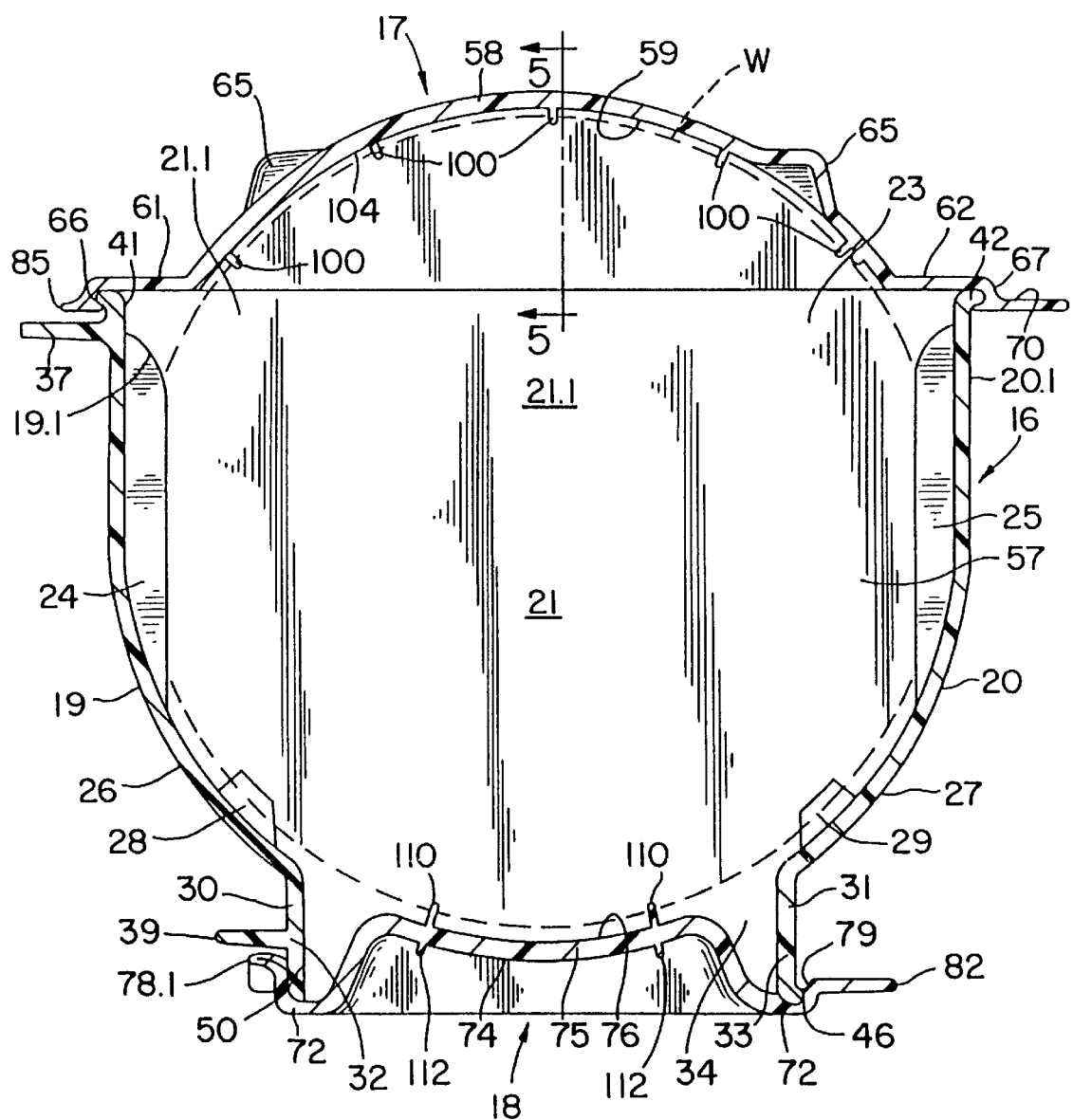
FIG. 3 is a sectional view through the shipping container, taken on a broken line as indicated at 3—3 of FIG. 1, and wherein the break is taken at the centerline indicated by dot-dash lines in FIG. 3 particularly indicating the tabs and elevation.

Referring to FIGS. 2 and 3, the sidewalls 19 and 20 have a multiplicity of upright ribs or teeth 24 and 25 formed integrally thereof and defining pockets or slots 25.1 therebetween for receiving and retaining the semiconductor wafers W in spaced relation with each other. The transparent polycarbonate of the sidewalls 19, 20 facilitate viewing the wafers to determine their presence and location. The sidewalls 19 and 20 also have rounded offset portions 26 and 27 shaped to conform generally to the shape of the wafers W to be carried therein. The offset portions have additional wafer separating lugs 28 and 29 for maintaining the wafers W in spaced relation to each other and in quiet relation with respect to each other.

The sidewalls 19 and 20 also have depending and parallel foot panels 30 and 31 defining the lower edge portions 32 and 33 of the sidewalls 19 and 20, respectively.

End walls 21 and 22 are both substantially flat or planar and have lower edge portions 34 and 35 which are arranged generally in the same plane as the lower edge portions 32 and 33 of the sidewalls 19 and 20. The interconnected lower edge portions 32, 33, 34 and 35 of the sidewalls and end walls cooperate to define the bottom opening 36 of the carrier between the foot panels 30 and 31 in order to provide access to the wafers W at the bottom of the carrier 16.

The sidewalls 19 and 20 have outwardly protruding tabs 37 and 38 molded integrally of the upper edge portions 19.1 and 20.1 of the sidewalls, and the tabs 37 are elongate and extend longitudinally along the sidewalls, substantially midway between the ends of the sidewalls, substantially as illustrated in FIG. 1. Sidewall 19 has lower tab 39 and sidewall 20 has a lower tab (not shown). These lower tabs protrude outwardly from the lower edge portions 32 and 33 of the sidewalls and specifically from foot panels 30 and 31 thereof. The lower tab on sidewall 20 is a mirror image of tab 39 on sidewall 19.

The upper edge portions 19.1, 20.1 of the sidewalls and the upper edge portions 21.1, 22.1 of the end walls define enlarged and outwardly flared upper rim portions 41, 42 on the sidewalls 19, 20 and rim portions 43, 44 on the end walls 21, 22, respectively. The enlarged upper rim portions 41–44 connect with each other and accordingly provide rim portions extending around the entire periphery of the carrier 16, i.e., along both sidewalls and end walls. The peripherally extending rim portions 41–44 lie substantially in a plane.

The sidewalls 19 and 20 and the end walls 21 and 22 also define enlarged and outwardly flaring lower rim portions 45, 46, 47 and 48, respectively, which join together and effectively provide lower rim portions around the entire periphery of the carrier 16. These lower rim portions lie substantially in a plane.

Each of the foot panels 30 and 31 has an indexing notch 49 formed therein to cooperate with indexing ribs or media in a processing machine for accurately locating the wafer carrier 16 in such a processing machine. The two lower rim portions 45 and 46 on the foot panels 30 and 31 of the sidewalls 19 and 20 diverge upwardly as at 50 and pass over the indexing notch 49. The shape of portion 50 illustrated in FIG. 2 may be defined by an arc passing over indexing notch 49 and extending almost the entire length of lower rim portions 45 and 46.

It is to be particularly recognized that all portions of the end walls 21 and 22 are of substantially uniform height, and of the same height as the sidewalls 19 and 20. The end wall 22 has a pair of widely spaced support bars 51 and 52 formed integrally thereof and extending into close proximity with the upper and lower edge portions 22.1 and 35, respectively, of the end wall 22. The support bars 51 have coplanar outer edges 53 to lie on a plane surface of a processing machine for the purpose of accurately locating the wafer carrier and the wafers relative to other equipment in the processing machine. The end wall 22 also has an indexing crossbar 54 formed integrally thereof, and is sometimes referred to as an "H-bar", extending transversely of the support bars 51, 52. The indexing crossbar 54 accurate locates the wafer carrier 16 in a processing machine by cooperating with the locating mechanism thereof. While the crossbar 54 is shown to extend entirely to the support bars 51, 52, but may extend only partially across the end wall 22 between the support bars.

It is to be particularly noted that both end walls 21 and 22 have the full height which is the same as the height of the sidewalls 19, 20; and the end walls 21 and 22, as well as the sidewalls, have the enlarged upper and lower rim portions which effectively extend around the entire periphery of the carrier 16. The end wall 22 in particular has panel portions 55 and 56, which respectively extend upwardly from the indexing crossbar 54 to the enlarged upper rim portion 44, and downwardly from the indexing crossbar 54 to the enlarged lower rim portion 48, respectively. Both of the panel portions 55 and 56 fill the entire spaces between the support bars 51, 52, which are formed integrally of the end wall 22.

Both the top cover 17 and the bottom cover 18, when applied to the upper and lower portions of the carrier to respectively close the top opening 23 and bottom opening 36 thereof, establish a substantially hermetic sealing relations with respect to the carrier to essentially prevent migration of air, moisture and contaminating particles either into or out of the open interior 57 of the carrier wherein the wafers W are stored. In addition, because both the top cover 17 and bottom cover 18 are formed or molded of a substantially stiff, but resiliently flexibly yieldable plastic material, these top and bottom covers 17, 18 may be flexed slightly during removal thereof so as to essentially peel the covers off the carrier by initially lifting one corner of the cover off the carrier and then progressively disengaging the remainder of the cover from the carrier.

The top cover 17 comprises a partially cylindrical panel or retainer portion 58 having the curvature substantially the same as the shape of the edges of the wafers W to be stored in the container 15. In one successful example of the container, the wafers may have a diameter of approximate eight inches (20.3 cm) and the curvature of the panel 58 appropriately substantially follows the curvature of the edge of panels of such size. The container 15 is also suited to store 6 inch (15 cm), twelve inch (30 cm) or larger wafers by making the container an appropriate size. The partially cylindrical panel 58 has a convex inner surface 59 facing the open interior 57 of the wafer carrier.

The top cover 17 also has substantially flat and planar side edge portions 61, 62, 63, 64. It will be recognized that the side edge portions 61, 62, adjacent the carrier sidewalls 19 and 20, provide springiness in the cover, and are substantially wider than the end edge portions 63, 64 which are adjacent the end walls 21, 22 of the carrier. The side edge portions 61–64 lie directly on the upper edge portions 19.1, 20.1, 21.1. and 22.1 of the carrier and contribute to maintaining the substantially hermetic seal between the carrier and the top cover.

Figure 5B:
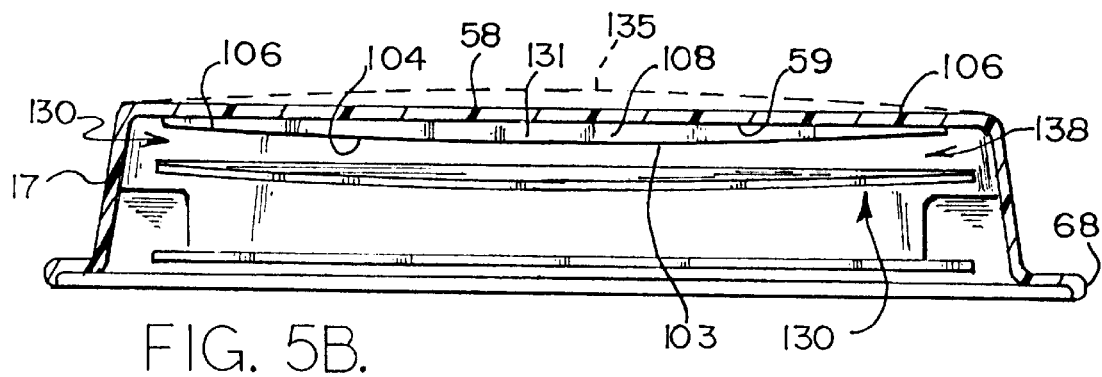
FIG. 5B is a sectional view taken at approximately 5—5 of FIG. 14 showing an alternative embodiment of the wafer cushioning means.
Figure 5C:
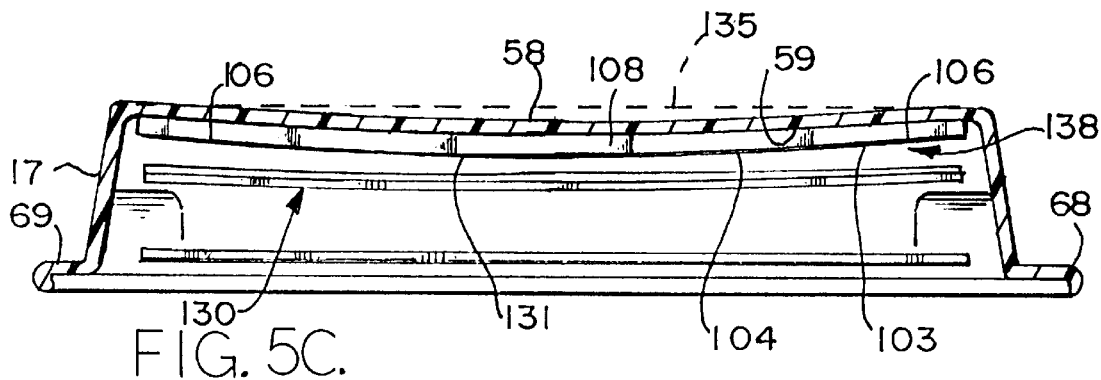
FIG. 5C is a sectional view taken at approximately 5—5 of FIG. 14 showing an alternative embodiment of the wafer cushioning means.
Figure 5A:
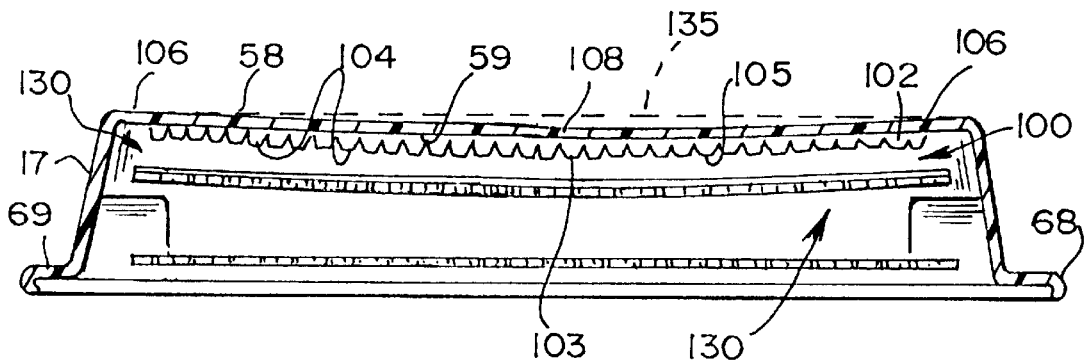
FIG. 5A is a sectional view taken at approximately 5—5 of FIG. 14 showing an alternative embodiment of the wafer cushioning means.
Figure 5:
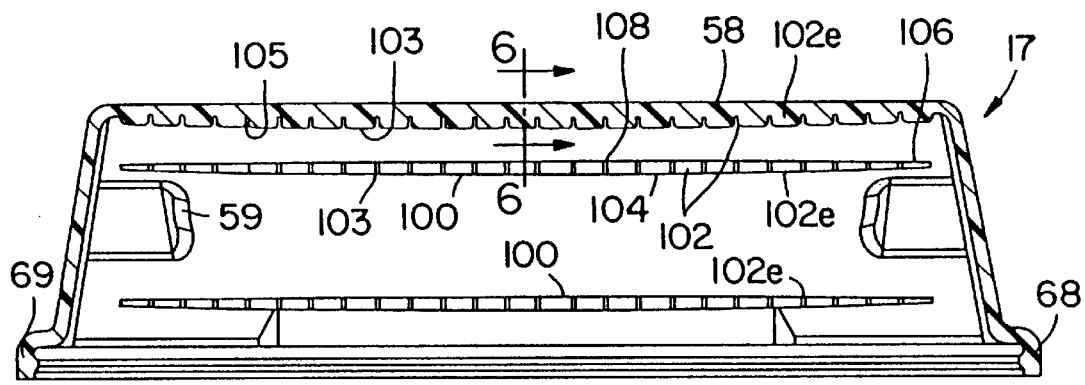
FIG. 5 is a sectional view taken at approximately 5—5 of FIG. 14.

Referring to FIG. 5, the cushioning means 130 for accommodating the flexing of the top cover 17 is illustrated as comprising a plurality of fins 131, each fin having a non-continuous wafer engaging edge 104 comprising a row 100 of resiliently flexible tabs 102 extending longitudinally along the partially cylindrical inner surface 59. As illustrated in FIG. 5, the rows 100 extend longitudinally along the top cover 17 and of the panel 58 so as to overlie and engage each of the wafers W with a wafer-engaging edge 104. The rows 100 are spaced from each other. A center row 100 is mounted centrally of the top cover. The spacing of the rows 100 accommodate the flats of the wafers W. Each of the rows 100 of tabs 102 has two end portions 106 and a middle portion 108. Each row 100 is substantially linear and attached to panel 58 along inner surface 59. The outer edge of each row 100 is generally indicated by numeral 103 and its shape is defined by the wafer-engaging edges 104 of adjacent tabs 102.

Figure 10:
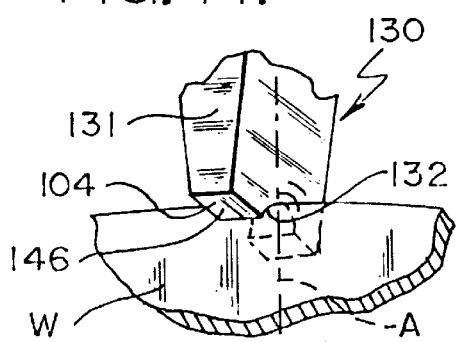
FIG. 10 is a perspective drawing illustrating the wafer cushioning means on the top cover engaging a wafer and crushing along a radius of the wafer.

Referring to FIG. 3A, each fin 131 protrudes radially toward the centerline 134 in the open interior 57 of the container 15 to engage wafers W (shown in outline). Each fin 131 engages each wafer W and structurally yields to support the wafers W and maintain a spaced relation between each wafer W and the panel 58. (see also FIGS. 7 and 10) It should be understood, the fins 131 illustrated as the tabs 102 of FIG. 5, are resiliently flexible and will bend (FIG. 7) or compress axially along the tab axis A without substantial bending where engaged with a wafer W (FIG. 10). The tab 102 will quickly regain its original shape to maintain contact with the wafer W and accommodate flexing of the top cover 17 to cushion the wafer W during shipment and storage.

Figure 4:
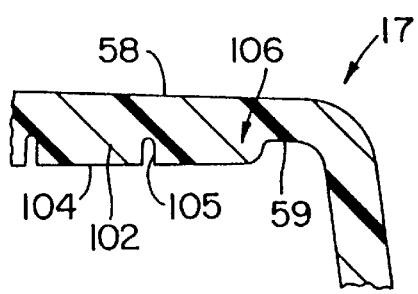
FIG. 4 is an enlarged detail section view taken at approximately 4—4 of FIG. 2.

Referring to FIG. 5, the tabs 102 are generally rectangular and have a width extending into the container 57. Each tab 102 has a length extending along the row 100 and is separated from adjacent tabs 102 by a slot 105. The length of each tab 102 along the row 100 is defined by the slot 105 (see also FIG. 4) and calibrated to allow each tab 102 to engage a single wafer W with a contact portion 132 on the wafer-engaging edge 104. The slot 105 allows each tab 102 to engage a wafer W independently of adjacent tabs 102. The wafer-engaging edge 104 is spaced from the cover 58 to engage and cushion wafers W that may be stored in container 15.

Continuing to refer to FIG. 5, the width of the tabs 102 measured from the panel 58 to the wafer engaging edge 104, may progressively increase and decrease along the row 100. The tabs 102 in the middle portion 108 are generally wider than tabs 102 located in the end portion 106. Tabs 102 in the middle portion of the row 108 are approximately 0.100 inches wide. Tabs 102 located at the end portion 106 are approximately 0.050 inches. These measurements are intended to illustrate the relative width of tabs along the middle 108 and end 106 portions of the row, they are not meant to limit the scope of the invention.

Continuing to refer to FIG. 5, tabs 102 located along the middle portion of the row 108 may be wider to allow the top cover 17 to flex and bow from the weight of wafers in the container 15 and the restraining force of the tabs 102 pressing against the wafers W. The wider tabs 102 located in the middle portion of the row 108 allow the top cover 17 to flex while maintaining contact with each wafer W by a independent wafer engaging edge 104. Under some conditions, it may be necessary for the width of tab 102 to increase in a nonlinear fashion along the row 100 from the middle portion 108 to each end portion 106.

Referring to FIG. 3A, the shape of the outer edge 103 of each fin 131 with respect to the centerline 134 of the container 15 is very important to maintaining contact each wafer W as the top cover 17 flexes. Each fin 131 is symmetrically formed around the radius 150. The outer edge 103 along each fin 131 defines a convex arcuate shape with respect to the centerline 134 of the container 15. The convex arcuate shape is further defined by a radial distance 136. The radial distance 136 is measured from the centerline 134 of the container 15 to wafer engaging edge 104 of each fin 131. It should be understood the wafers are aligned with the centerline 134 of the container 15. A radius of a wafer is therefore aligned with the radius 150 of the container 15. The radial distance 136 progressively increases from a point proximate to the middle portion 108 (FIG. 5) of each fin to a larger radial distance 136 adjacent each end portion 106 (FIG. 5) of each fin 131.

As illustrated in FIG. 5, the cushioning means 130 for accommodating flexing of the top cover 17 has an outer edge 103. The shape of the outer edge 103 is defined by the wafer engaging edges 104 of adjacent tabs 102 along a row 100. The tabs 102 may have a common fin-like base as shown in FIG. 5.

Referring to FIG. 5A, the cushioning means 130 for accommodating flexing of the top cover 17 may further comprise a convex arcuate shape of the panel 58 with respect to the centerline 134 of the container 15 forming the convex arcuate shape along the outer edge 103 of each row 100. In this embodiment, each tab 102 may be approximately the same width. The tabs 102 may individually extend from the panel 58 without the common fin-like base as shown in FIG. 5. The darken line 135 in FIGS. 5A, 5B and 5C shows the portioning of the panel 58 when engaged with the wafers.

Referring to FIGS. 5 and 5A, each tab 102 is separated from adjacent tabs 102 along the row 100 by a slot 105. The slots 105 and wafer engaging edges 104 of adjacent tabs 102 define a discontinuous arcuate shaped outer edge 103 along each row 100.

Figure 6:
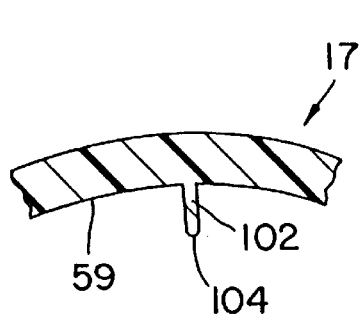
FIG. 6 is an enlarged detail section view taken at approximately at 6—6 of FIG. 5.
Figure 7:
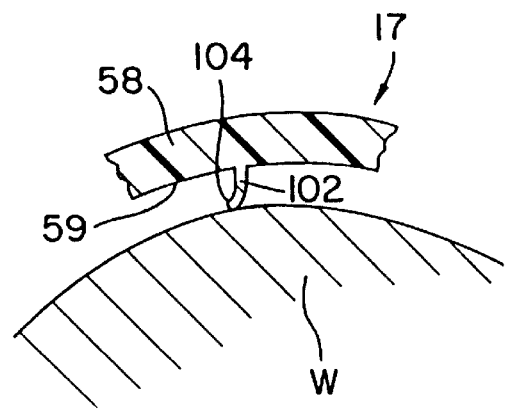
FIG. 7 is an enlarged detail section view taken at approximately 6—6 of FIG. 5 showing the tab bendingly engaging a wafer.

Referring to FIG. 3A, a plurality of rows 100 of tabs 102 may be distributed across the top cover 17 along the inner surface 59. A single row 100 may be centered along the inner surface 59 between the sidewalls 19 and 20. Rows 100 of tabs 102 may also be displaced between the center row 100 and the side portions 61, 62 of the top cover 17. As illustrated in FIG. 6 and 7, fins 131 may be integrally molded with the top cover 17 to minimize manufacturing costs.

As illustrated in FIG. 5, a set of corresponding tabs is labeled 102 for reference. Each set of corresponding tabs 102 will engage and cushion a particular wafer W. The relative width of the tabs 102 in each of the respective rows 100 may vary from row to row to accommodate different shape covers 17 and different amounts of flex in the top cover 17. A row 100 centered along panel 58 may have tabs which are shorter than the corresponding tabs of rows 100 displaced between the center row 100 and the side portions 61, 62 to accommodate for a difference in the radius of the wafers W and the radius of the cylindrical inner surface 59.

Referring to FIGS. 5B and 5C, the cushioning means 130 for accommodating flexing of the top cover 17 may comprise a plurality of fins 131 comprising a continuous strip 138 extending from the inner surface 59 of panel 58. The continuous strip 138 has a wafer engaging edge 104 spaced a radial distance 136 from the centerline 134 (FIG. 3A) of the container 15 to form a convex arcuate shape as described above. This convex arcuate shape accommodates flexing of the top cover 17 due to the wafers W bearing against the cushioning means and forcing it outwardly. As illustrated in FIG. 5B, the panel 58, along the base of the fin 131, may have a cylindrical shape being substantially parallel to the centerline 134 of the container 15 (FIG. 3A). The width of the fin 131 progressively decreases from the middle portion 108 to the end portion 106 to form the convex arcuate shape of the outer edge 103 with respect to the centerline 134 of the container 15 (FIG. 3A).

As shown in FIG. 5C, the cushioning means 130 for accommodating flexing of the top cover 17 may include the panel 58 formed having a convex arcuate shape with respect to the centerline 134 of the container 15 (FIG. 3A) when in a first unflexed position. As illustrated in outline in FIG. 5C, the panel 58 may be substantially parallel to the centerline 13 (FIG. 3A) when the container 15 is loaded with wafers W in a second flexed position.

Figure 5D:
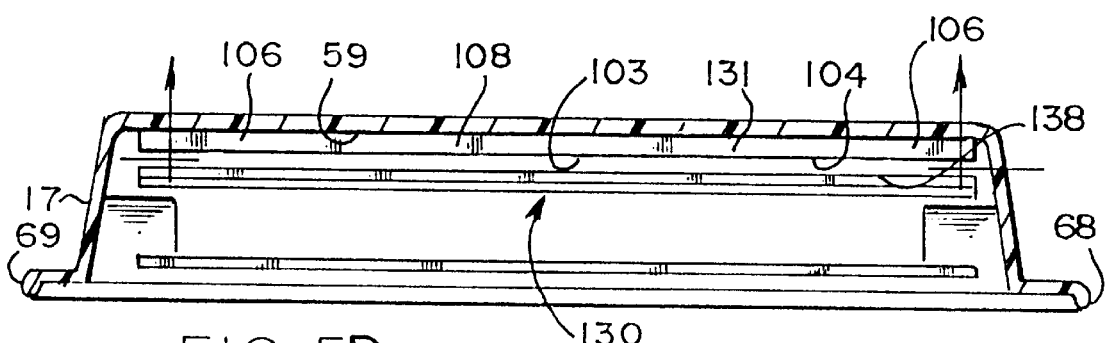
FIG. 5D is a section view taken at approximately 5—5 of FIG. 14 showing an alternative embodiment of the wafer cushioning means.

Referring to FIG. 5D, the cushioning means 130 for accommodating the flexing of the top cover 17 may comprise a fin 131 and the panel 58 formed substantially parallel to the centerline 134 (not shown in this view). In this embodiment, the flexing of the top cover 17 is accommodated by changing the structure of the fin 131 from the middle portion 108 to the end portions 106. In this embodiment, the compressibility of the fin 131 may be changed by varying the structure or the thickness of the fin 131. The cushioning means 130 for accommodating the flexing of the top cover 17 may also comprise changing the thickness of the panel 58. The panel 58 may have a thickness which progressively decreases from adjacent the middle portion 108 of each fin 131 to a smaller thickness adjacent each end portion 106 of each fin 131.

Referring to FIG. 10, the fin 131 in the top cover 17 will axially compress to engage the wafer W at the wafer engaging portion 132.

Figure 11:
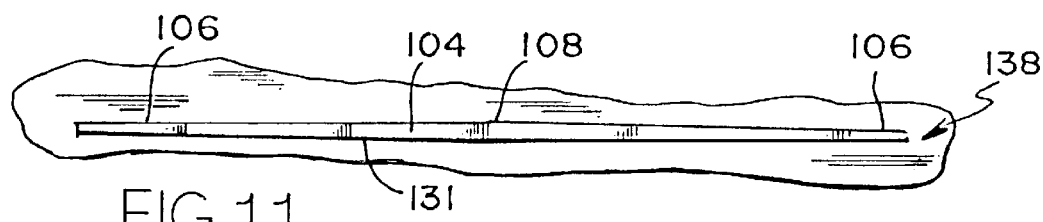
FIG. 11 is a perspective view taken at approximately 11—11 of FIG. 5D.

As shown in FIG. 11, the thickness of the fin 131 may vary from a larger thickness along the middle portion 108 of the fin 131 to a smaller thickness along each end portion 106 of the fin 131. The compressibility of the fin 131 along the length of the fin 131 may be varied in a manner by changing the structure to a modified I-beam or removing material in steps. The structural accommodation of the flexing of the top cover 17 by changing the compressibility along the fin 131 may be used regardless of whether the fin 131 is a continuous strip 138 or a row 100 of tabs 102.

Referring to FIG. 6, the cross section of the fin 131 is shown having a tapering shape. The fin is shown having a wide thickness adjacent the inside surface 59 of the panel 58 and a more narrow thickness spaced from the inside surface 59. It should be understood, the fin 131 is directed inward along a radius 150 of the container 15 extending from the centerline 134 (FIG. 3A).

Referring to FIG. 6A, the fin 131 is shown having a bead shape 140. The bead shape 140 is symmetrical along the radius 150 (FIG. 3A). The bead shape 140 has a wafer engaging edge 104 illustrated as a curved surface 142.

Referring to FIG. 6B, the fin 131 is shown having a sharp knife edge 144 at the wafer engaging edge 104.

Referring to FIG. 6C, the wafer engaging edge 104 is shown as a flat surface 146 on the end of the fin 131 directed radially inward into the container 15 along radius 150 (FIG. 3A). The fin 131 is symmetrical around the radius 150 (FIG. 3A) and the flat surface 146 is generally perpendicular to the radius 150 (FIG. 3A) to accommodate crushing of the fin 131 a radius of the wafer to resiliently engage and support the wafer W.

Referring to FIG. 6D, the wafer engaging edge 104 is shown as a rounded edge 142 spaced from the inner surface 59 of the panel 58. The fin 131 is symmetrically formed around the radius 150 (FIG. 3A).

The top cover 17 also has a multiplicity of deformations or stacking offsets 65 formed in the panel 58 to facilitate stacking of the containers one upon another.

The top cover 17 also has enlarged top cover rim portions extending around the entire periphery of the top cover and more specifically, the top cover has inwardly protruding enlarged top cover rim portions 66, 67 extending along the side edge portions 61, 62 of the top cover; and has enlarged top cover rim portions 68, 69 extending along the end edge portions 63, 64. When the top cover 17 is applied onto the carrier 16, the rim portions 66–69 engage and embrace the rim portions 41–44 of the carrier 16 in substantially hermetic sealing relation. The rim portions 66–69 of the top cover 17 and rim portions 41–44 of the carrier provide a snap fit for securing the top cover 17 onto the carrier 16. The interfitting rim portions 66–69 on the cover and the rim portions 41–44 on the carrier 16 provide the sole means by which the top cover 17 is anchored onto the carrier 16, i.e., there is no other latching device for holding the top cover 17 onto the carrier 16.

Top cover 17 also has a pair of tab portions 70, 71 which protrude outwardly from the rim portion 67 and extend longitudinally along the rim portion 67 and side edge portion 62 adjacent the ends of the top cover to be in offset relation with respect to the adjacent tab 38 on the carrier 16. The tabs 70, 71 are useful in completing closing of the top cover 18 onto the carrier 16. In the final stages of applying the top cover, the tabs 70, 71 may be manually squeezed toward the tab 38 on the carrier to assure that application of the bottom cover is completed, and that the snap fit has been finished. Top cover 17 may also have symmetrically located tabs on rim portion 66.

Although technicians using the container 16 may devise various procedures of applying and removing the top cover 17, it has been found to be successful to first place the top cover 17 upon the upper edge portions of the side and end walls. The two corners of the top cover may be pressed, initially, onto the rim portions of the side and end walls using the palm or heel of the person's hands. Then the side edge portions 61, 62 of the top cover are progressively pressed onto the rim portions 41, 42 at the sidewalls of the carrier, until the entire rim portions 66–69 of the cover have achieved and completed the snap fit onto the adjacent rim portions 41–44 of the carrier.

For removing the top cover 17, a corner portion, such as adjacent rim portions 67 and 69, are lifted off the adjacent rim portions 42, 44 of the carrier, and the corner portion of the top cover is flexed upwardly. The rim portions are progressively separated by lifting on the top cover until the cover is free of all of the rim portions 41–44 of the carrier.

The particular materials from which the carrier 16 and top cover 17 are formed are highly resistant to abrading and scuffing and accordingly, the generation of particulate is minimized as the cover is lifted off or applied onto the carrier.

The bottom cover 18 has side edge portions 72 and end edge portions 73 which respectively underlie the lower edge portions 32, 33 and 34, 35 of the carrier and engage the lower edge portions of the end walls and sidewalls of the carrier to contribute materially to a substantially hermetic sealing relation between the bottom cover 18 and the carrier 16.

The bottom cover 18 also has a bottom cylindrical panel 75 having an inner surface 76 defining the bottom of the interior wafer confinement area 57. A cushioning means 130 is formed on the inner surface 76 of the bottom cover 18 to support and space the wafers from the bottom cylindrical panel 75.

Referring to FIG. 3A, a second cushioning means 130.1 for accommodating flexing of the bottom cover 18 may comprise a bottom fin 148 extending longitudinally of the bottom cover 18. In the embodiment shown in FIG. 10, two bottom fins 148 are formed on the bottom cover 18 and have a shape (FIG. 12) designed to bend outwardly when engaged by the wafer to support the wafer W and prevent the wafer from rotating. Each bottom fin 148 on the bottom cover 18 has a wafer engaging edge 114 which is spaced from the centerline 134 of the container 15 by a radial distance 136. Each bottom fin 148 on the bottom cover 18 may, alternatively, be of similar shape to the fin 131 on the top cover 17. The bottom fin 148 on the bottom cover 18 may have a wafer engaging edge 114 of a similar shape as the fin 131 on the top cover 17. The wafer engaging edge 114 on the bottom fin 148 may have a flat shape 146 (FIG. 12) or may have a knife edge shape (not shown) or a rounded edge 142 (FIG. 3A) as discussed above.

Figure 8:
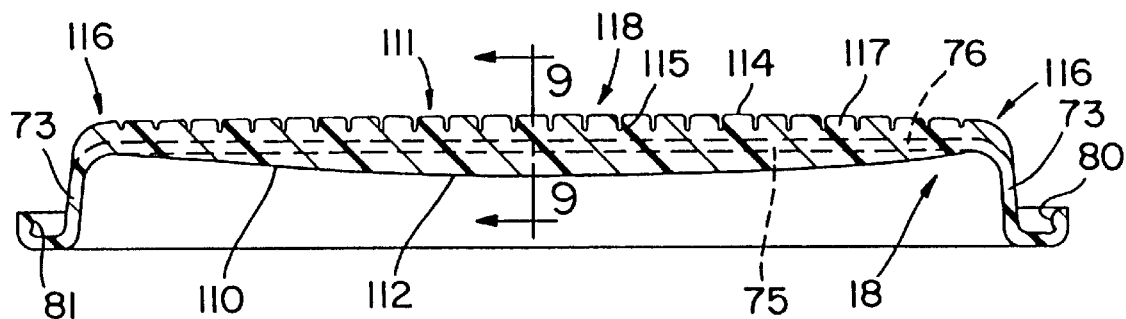
FIG. 8 is a section view taken at approximately 8—8 of FIG. 2.
Figure 9:
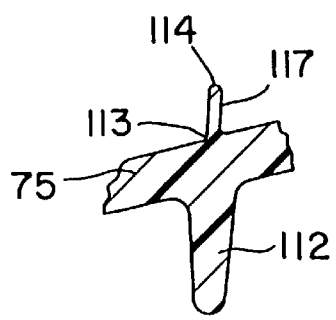
FIG. 9 is an enlarged detail section view taken at approximately 9—9 of FIG. 8.
Figure 14:
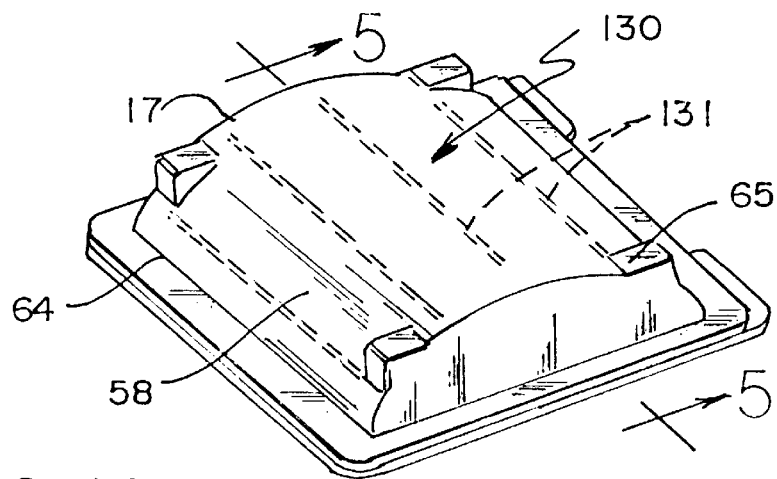
FIG. 14 is a perspective view of a top cover.

Continuing to refer to FIG. 3A, the bottom fin 148 on the bottom cover 18 may be a continuous strip 149 or a noncontinuous row 110 of resiliently flexible tabs 117 as illustrated in FIG. 8. The second cushioning means 130.1 on the bottom cover 18 is illustrated in FIG. 8 as a plurality of fins 148 having a noncontinuous wafer engaging edge 114 forming a row 110 of resiliently flexible tabs 117. The tabs 117 on the bottom cover 18 are substantially similar to the tabs 102 on the top cover 17. Continuing to refer to FIG. 8, each fin 148 on the bottom cover 18 has two end portions 116 and a middle portion 118. Each fin 148 has a wafer engaging edge 114 which may have a convex arcuate shape for accommodating flexing of the bottom cover 18 as discussed above with respect to the centerline 134 (FIG. 3A).

Continuing to refer to FIG. 3A, the second cushioning means 130.1 for accommodating flexing of the bottom cover 18 may be formed of a structure similar to the cushioning means 130 for accommodating flexing of the top cover 17 as discussed above. The radial distance 136 from the centerline 134 of the container 15 to the wafer engaging edge 114 of the bottom fin 148 on the bottom cover 18 progressively decreases from the middle portion 118 to each end portion 116 (FIG. 8). This progressively changing radial distance 136 may be formed by an arcuate shape of the bottom fin 148 with respect to the bottom cover 18 or an arcuate shape of the bottom cylindrical panel 75 with respect to the centerline 134 of the container 15. As discussed above with respect to the top cover 17 illustrated in FIG. 5D above, the bottom cover 18 may have a bottom cylindrical panel 75 which has a thickness progressively decreasing from adjacent the middle portion 118 of each bottom fin 148 to the portion of the bottom cylindrical panel 75 adjacent each end portion 116 of the bottom fin 148 on the bottom panel 18.

Continuing to refer to FIG. 3A, the second cushioning means 130.1 for accommodating flexing of the bottom cover 18 may also include a structure on the bottom fin 148 on the bottom cover 18 to change the compressibility of the fin 131 from a highly compressible design adjacent the middle portion 118 and a less compressible design adjacent each end portion 116. The bottom fins 148 on the bottom cover 18 work with the fins 131 on the top cover 17 to suspend the wafers in the container 15 between the wafer engaging edges 104, 114 during shipment and storage while equally distributing the retaining force across all the wafers W and allowing for bowing or flexing of either or both of the covers 17, 18.

Referring to FIG. 3A, it should be understood as the bottom cover 18 is applied to the carrier 16, the wafer engaging edge 114 of each fin 148 on the bottom cover 18 will engage each wafer W and lift it from its resting position along the sidewalls 19 and 20. The wafer W will be suspended between the bottom fins 148 on the bottom cover 18 and the fins 131 on the top cover 17.

Referring to FIG. 8, the second cushioning means 130.1 for accommodating flexing of the bottom cover 18 may also comprise reinforcing on the bottom cover 18 to resist flexing of the bottom cover 18 as the bottom cover 18 is applied to the carrier 16. The bottom cylindrical panel 75 may have a thickness which varies from adjacent the middle portion 118 of each fin 148 to adjacent each end portion 116 of each fin 148 on the bottom cover 18. Alternatively, the bottom cover 18 may have a plurality of supporting ribs 112 on outside panel 75. These support ribs 112 extend downwardly from the bottom cover 18 and outwardly from the container 15. Each supporting rib 112 is parallel to a fin 148 on the bottom cover 18. This rib 112 strengthens the bottom cover 18 to reduce bowing or flexing when wafers W are inserted into the container 15 and engaged with the cushioning means 130 for accommodating flexing of the cover.

Figure 12:
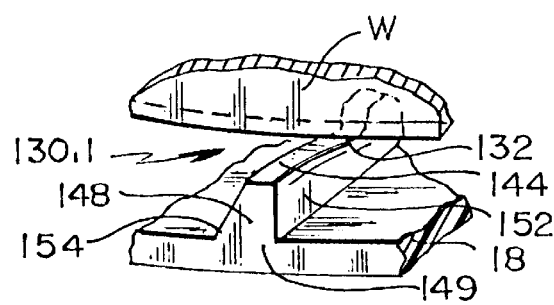
FIG. 12 is a perspective view of the wafer cushioning means on the bottom cover engaging a wafer and bending outwardly.

Referring to FIG. 12, each bottom fin 148 has an outside wall surface 152 formed substantially vertical from the bottom panel 75. Each bottom fin 148 also has an inside wall surface 154 formed at an acute angle to the vertical outside wall surface 152. The inside wall surfaces 154 on the two bottom fins 148 are opposing to each other. The wafer engaging edge 114 on the bottom fin 148 extends between the outside wall surface 152 and the inside wall surface 154 to engage the wafer. This structure of the bottom fin 148 allows the wafer engaging portion 132 to force the bottom fin 148 to bend outwardly over the outside wall surface 152. This outwardly bending locks the wafer W from rotating in the container 15 while spacing the wafer W from the bottom panel 75 and accommodating flexing of the bottom cover 18.

The bottom cover 18 also has rim portions extending around the entire periphery of the bottom cover and more specifically, the bottom cover comprises enlarged rim portions 78, 79 extending along the side edge portions 72 of the bottom cover and embracing the rim portions 45, 46 of the sidewalls 19, 20 of the carrier. The bottom cover also enlarged bottom cover rim portions 80, 81 extending along the end edge portions 73 of the bottom cover and embracing the enlarged rim portions 47, 48 of the end walls of the carrier 16. The rim portions 78, 79, 80 and 81 lie substantially in a plane and embrace the rim portions 45, 46, 47 and 48 of the wafer carrier in a snap fit and in a substantially hermetic sealing relation to retain the bottom cover on the wafer carrier. The rim portions 78–81 of the bottom cover and the rim portions 45–48 of the wafer carrier comprise the sole means by which the bottom cover is retained on the wafer carrier, i.e., there need be no supplemental latching means for holding the bottom cover on the carrier.

The substantially hermetic seal between the carrier 16 and the top and bottom covers 17, 18 prevents movement of air, other gases, moisture and particles into and out of the container 15, and prevents the carrier from burping or sucking as atmospheric pressures change.

The bottom cover 18 also has a pair of elongate tab portions 82, 83 extending longitudinally along one of the side edge portions 72 and adjacent the rim portion 79 of the bottom cover. The tab portions 82, 83 lie adjacent, but in offset relation, with respect to the adjacent tab 40 on the lower side edge portion of the wafer carrier so as to facilitate a person simultaneously engaging and squeezing both of the tab portions 83 and 40 and assuring that the snap fit has been completed in applying the bottom cover onto the carrier. Ordinarily the bottom cover 18 is applied to the carrier by laying the bottom cover 18 on a support table, then the carrier 16 is placed upon the bottom cover and pressed so as to secure the carrier 16 and cover 18 together in a snap fit. If the wafers W are already in the carrier, the wafers will be lifted by the bottom cover 18 off the offset portions 26, 27 of the sidewalls 19, 20. Bottom cover 18 may also have a pair of symmetrically located tabs on the side edge portion 72 opposite tab portion 82 and 83.

In removing the bottom cover 18 from the wafer carrier, one corner portion of the bottom cover is flexed, as above described in connection with the top cover, and the bottom cover 18 may thereby be progressively disengaged from the enlarged lower rim portions 45–48 of the wafer carrier for removing the bottom cover. The rim portions 78–81 of the bottom cover engage and embrace the rim portions 45–48 of the wafer carrier and establish a substantially hermetic sealing relation between the bottom cover 18 and the wafer carrier to prevent migration of air, moisture and particulate into or out of the interior 57 of the wafer carrier. Whereas the bottom cover rim portions 78–81 lie substantially in a plane, portions 78.1, 79.1 of the rim portions 78, 79 extending along the side edge portions 72 of the bottom cover, are diverted out of the plane of the remainder of the bottom cover rim portions to conform to the shape of the portions 50 of the rim portions 45, 46 which diverge out of the planes of the rim portions on the wafer carrier and pass over the index notches 49 in the foot panels 30, 31 of the wafer carrier.

The bottom cover 18 also has outwardly protruding lip portions 84 protruding outwardly all around the periphery of the bottom cover except at the tabs 82, 83 to add strength to the bottom cover. Similarly, the top cover 17 has outwardly protruding lip portions 85 protruding outwardly from the edge portions of the top cover all the way around the periphery of the top cover except at the tabs 70, 71 to provide additional strength to the top cover.

Figure 13:
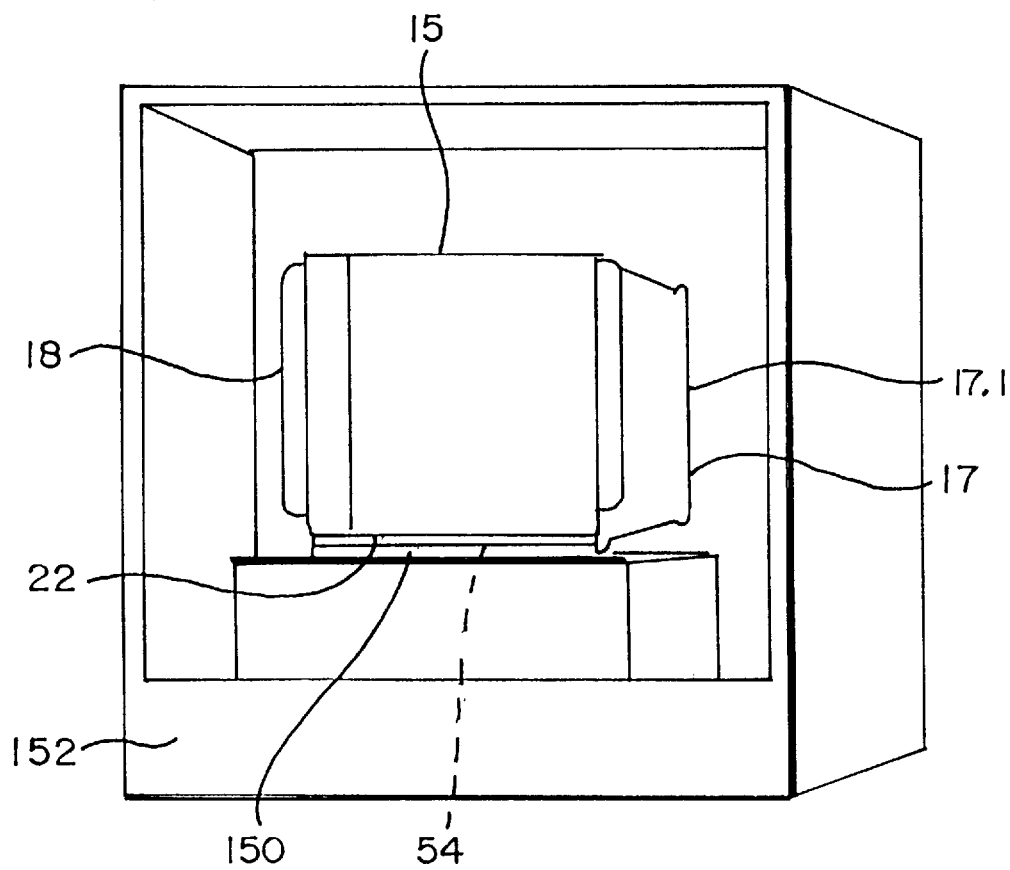
FIG. 13 is an elevational view of a shipping container having a side entry with horizontal orientation of the wafer.

Referring to FIG. 13, the container 15 is intended to be used with its end wall 22 with the H-bar 54 engaged with an interface on processing equipment. The top cover 17 thus in use may have different orientations than that shown in FIG. 1 such as where the top cover 17 and bottom cover 18 are vertically positioned as in FIG. 13. In this orientation the wafers (not shown) are horizontally orientated and the top cover 17 is functionally a side cover 17.1.

The use of the terms top, end, bottom, and side in the claims are used only for purposes of showing the relative positioning of the elements of the invention with respect to each other and are not to be interpreted to restrict the scope of the claims with respect to differently oriented containers 15.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A container for wafers comprising:
    a) an integral carrier having two opposing sidewalls and two endwalls adjoining the sidewalls, a top opening and an interior wafer confinement area wherein the wafers are received, the container having wafer supports on each sidewall, the wafer supports positioned for maintaining the wafers in a spaced axial alignment;
    b) a top cover removably engageable with the carrier to close the top opening, the top cover having a periphery and at least two opposite rim portions at the periphery for engagement with the carrier, the retainer portion traversing between and integral with the rim portions, and a row of wafer engaging members extending from the retainer portion for engaging and cushioning the wafers, the rim portions and the retainer portion comprised of a resilient flexible material whereby the retainer portion flexes outwardly when the top cover is attached to the carrier loaded with wafers, the row of wafer engaging members having a pair of end portions and a middle portion, the shape of the wafer engaging members varying from the end portions to the middle portion such that the outward flexing of the retainer portion is accommodated and the retaining force on each wafer is balanced.

2. The container of claim 1, wherein the engagement members comprising a fin positioned on the inside of the top cover, and a wafer engaging edge on the fin spaced from the top cover.

3. The container of claim 1, wherein the row of wafer engaging members comprise a row of tabs, each tab having a wafer engaging portion.

4. The container of claim 1, wherein the engagement member in the row being variably compressible along the length of the row, the engagement members toward the middle portion being more compressible than the engagement members adjacent each end portion.

5. The container of claim 2 wherein the fin has a thickness, the thickness of the fin progressively changing from a thickness adjacent the middle portion of the fin to a smaller thickness adjacent each end portion of the fin.

6. The container of claim 1 wherein the row is radially aligned with the centerline of the container.

7. The container of claim 3 wherein the shape of the wafer engaging portions on the row of tabs with respect to the interior of the carrier is convex and arcuate.

8. The container of claim 7 wherein the convex arcuate shape of the wafer engaging portion of the row of tabs is formed by each wafer engaging member having a width defined as the distance between the wafer engaging portion and the retainer portion, the width of each wafer engaging member being greater adjacent the middle portion and smaller adjacent each end portion.

9. The container of claim 1 wherein each wafer engaging member has a flat wafer engaging portion and, wherein the wafer engaging members compress substantially without bending when engaged by a wafer in the carrier.

10. The container of claim 6 wherein the wafers are substantially round, a radius in the container extending from the centerline of the container and intersecting each wafer engagement member, each wafer engagement member symmetrically formed around the radius to engage the substantially round wafer by compressing substantially without bending along the radius.

11. The container of claim 1, wherein the carrier comprises an open bottom and the container comprises a bottom cover to close said open bottom, the bottom cover having a row of wafer engagement members for engaging the wafers and for suspending the wafers between the bottom cover and the top cover.

12. The container of claim 11 wherein the the bottom cover further comprises a pair of rows of wafer engagement tabs spaced from each other and extending along the bottom cover, the tabs each having outside wall surfaces being substantially vertical, and inside wall surfaces formed at an acute angle to the outside wall surfaces, a wafer engaging edge between the outside wall surfaces and the inside wall surfaces, wherein the rows of tabs bend outwardly away from each other when engaged by the wafers to support the wafer and space the wafer from the bottom wall.

13. The container of claim 3 further comprising an outer edge on each wafer engagement member, the spacing of the wafer engaging edge from the top cover defining a width, the row having a middle portion, and two end portions, the width progressively decreasing from the middle portion to each end portion.

14. The container of claim 13 wherein the width of the wafer engagement members progressively decreases in a nonlinear fashion from the middle portion to the end portion of each fin.

15. The container of claim 13 wherein the container has a centerline and the outer edge of each row of wafer engagement members forms a convex arcuate shape with respect to the centerline of the container.

16. The container of claim 2 wherein a center fin is positioned centrally on the cover between the side walls.

17. A device for storing and shipping wafers, the device comprising:
  a) a carrier having two sidewalls and two end walls defining an interior chamber, a removable top cover to provide access into the interior chamber wherein such wafers are received and stored, the container having wafer separating ribs on each of the sidewalls to maintain the wafers in a spaced and confronting relationship to each other, the wafers transversely oriented of the sidewalls, the top cover sealingly attaching to the end walls and sidewalls, the bottom cover sealingly attaching to the sidewalls and end walls, whereby the interior chamber is sealed to resist contamination from environmental elements outside of the device; and
  b) a plurality of fins of resilient compressible material on the top cover, each fin extending longitudinally on the inside of the top cover, the fins spaced from each other, each fin having a middle portion and two end portions, a wafer engaging edge on each fin, the wafer engaging edge spaced from the top cover, the wafer engaging edge on each fin spaced from the centerline of the container by a radial distance, the radial distance progressively increasing from the middle portion of each fin to the end portions of each fin to thereby position the wafer engaging edge of each fin in a convex arcuate shape with respect to the centerline of the container whereby the wafers are engaged and cushioned in the container, the fins compressing to balance the retaining force across each of the wafers while accommodating flexing of the top cover when in position on an unloaded carrier.

18. The device of claim 17 wherein the progressively changing radial distance is formed by an arcuate convex shape of the top cover with respect to the centerline of the container.

19. The device of claim 17 further comprising a width of the fin defined from the top cover to the wafer engaging edge, the width of the fin progressively decreasing from the middle portion of the fin to each end portion whereby the wafer engaging edge has a convex arcuate shape with respect to the centerline of the container.

20. The device of claim 17 wherein each fin comprises a row of compressible tabs, each tab separated from an adjacent tab by a slot, the wafer engaging edge being noncontinuous along the fin, and each tab has a wafer engaging portion.

21. The device of claim 17 wherein the carrier has an open bottom and the device comprises a bottom cover to close the open bottom, the bottom cover having a plurality of fins for supporting the wafers whereby when the carrier is loaded with wafers, the wafers are suspended by and between the top cover and the bottom cover.

22. The device of claim 21 wherein each fin is directed inwardly into the interior chamber and is aligned with the centerline of the container when the top cover is on the container.

23. The device of claim 17 wherein the top cover is formed of a resilient flexible material and has a stacking structure on an outside surface of the top cover.

24. The device of claim 17 wherein the top cover is formed of a resilient flexible material having a thickness, the thickness of the top cover progressively decreasing from adjacent the middle portion of each fin to the end portion of each fin whereby the top cover resists flexing, and the changing thickness of the top cover forms the progressively changing radial distance.

25. The device of claim 21 further comprising a convex arcuate shape of the wafer engaging edge of each fin with respect to the centerline of the container, the convex arcuate shape defined by a radial distance between the centerline of the container and the wafer engaging edge, each fin on the bottom cover having a middle portion and two end portions, the radial distance from the centerline progressively decreasing from the middle portion of each bottom fin to the end portions of each bottom fin.

26. The invention of claim 25 wherein each bottom fin is oriented substantially vertically on the bottom cover whereby the bottom fin bends outwardly when engaging the wafer to secure the wafer and resist rotation of the wafer in the container.

27. A container for storing and shipping wafers comprising:
  a) an integral carrier having two opposite sidewalls attached to two opposite end walls spaced from each other, a bottom wall sealingly attached to the sidewalls and the end walls to define an interior wafer confinement area;
  b) a removable top cover having a first unflexed position when in place on the container in an unloaded condition, the top cover having a second flexed position when in place on the container in a loaded condition, the top cover having a plurality of rows of wafer engaging portions extending into the interior wafer confinement area, each row having an end portion adjacent each end wall and a middle portion between the end portions, the top cover flexing a greater distance adjacent the middle portion of each row and flexing a smaller distance adjacent the end portions; and
  c) each row of wafer engaging portions forming an arcuate shape when the top cover is in the first unflexed position and the wafer engaging portions forming a substantially linear shape when the top cover is in the second flexed position.

28. The container of claim 27 wherein the top cover is further comprised of a panel with an inside surface wherein the arcuate shape of the wafer engaging portions is formed by the shape of the panel, the wafer engaging portions spaced from the inside surface by a width, the width being substantially similar adjacent the middle portion and the end portions of each of the plurality of rows.

29. The container of claim 27 wherein the bottom wall is a removable bottom cover with an inner surface and wherein a pair of rows of wafer engaging portions extend longitudinally on the bottom cover, the wafer engaging portions of each row spaced from the inner surface of the bottom cover and formed in an arcuate shape in a first unflexed position, the wafer engaging edge forming a substantially linear shape when the bottom cover is in a second flexed position.

30. The container of claim 27 wherein the top cover has an inside surface and wherein the arcuate shape of each of the plurality of rows on the top cover is formed by spacing the wafer engaging portions from the inside surface of the top cover by a width, the width progressively decreasing from the middle portion to the end portions.

31. The container of claim 27 further comprising a stacking structure on the top cover, the stacking structure maintaining a fixed position with respect to the container when the cover is in the first unflexed position and the second flexed position, the stacking structure positioned adjacent to the intersection of the sidewalls and end walls.

32. The container of claim 31 wherein the stacking structure further comprises a multiplicity of stacking offsets formed on the top cover, the stacking offsets having a substantially flat surface, the flat surface of each stacking offset in a planar relation with the other flat surfaces of other stacking offsets.

33. The container of claim 31 further comprising a plurality of side edge portions on the bottom of the container for engaging the stacking offsets whereby a plurality of containers may be stacked having the weight of stacked containers supported by the sidewalls and end walls of the container interior wafer confinement area.

34. The container of claim 27 further comprising a plurality of rows of tabs with each tab having one of the wafer engagement portions.

35. The container of claim 34 wherein the compressibility of the tabs vary along each row and wherein the tabs proximate to the end walls of the container are more compressible, than the tabs toward the middle of each row.

36. A device for storing and shipping semiconductor wafers, the device comprising:

a) a container with two side walls and two end walls integral with the side walls and defining an interior chamber, the container having an open top and an open bottom, each of the side walls having a plurality of wafer separating ribs for maintain the wafers in a spaced and confronting relationship to each other;

b) a flexible top cover sized to sealingly cover the open top, the flexible top cover including integral wafer engaging portions for engaging the wafers; and c) a flexible bottom cover for sealingly closing the open bottom of the container, the bottom cover having integral wafer engaging portions for engaging the wafers, the top cover and bottom cover configured to suspend the wafers between the respective wafer engaging portions of the top cover and bottom cover when said top cover and bottom cover are attached to the carrier.

37. The device of claim 36, wherein the flexible top cover and flexible bottom cover bow outward when attached to the container and wherein the wafer engaging portions are positioned for compensating for said bowing.

* * * * *